United States Patent [19]

Jeuch

[11] Patent Number: 4,518,629
[45] Date of Patent: May 21, 1985

[54] PROCESS FOR POSITIONING AN ELECTRICAL CONTACT HOLE BETWEEN TWO INTERCONNECTION LINES OF AN INTEGRATED CIRCUIT

[75] Inventor: Pierre Jeuch, Seyssins, France

[73] Assignee: Commissariat a l'Energie Atomique, Paris, France

[21] Appl. No.: 559,441

[22] Filed: Dec. 8, 1983

[30] Foreign Application Priority Data

Dec. 10, 1982 [FR] France ................................ 82 20721

[51] Int. Cl.³ .......................................... H01L 21/88
[52] U.S. Cl. .................................... 427/89; 156/643; 156/644; 156/652; 156/653; 427/90; 427/96
[58] Field of Search ............................. 427/89, 90, 96; 156/643, 644, 652, 653

[56] References Cited

U.S. PATENT DOCUMENTS

| | | | |
|---|---|---|---|
| 4,025,411 | 5/1977 | Hom-Ma | 156/643 |
| 4,070,501 | 1/1978 | Corbin et al. | 427/88 |
| 4,123,565 | 10/1978 | Sumitomo | 427/90 |
| 4,185,294 | 1/1980 | Sumitomo et al. | 357/54 |
| 4,305,974 | 12/1981 | Abe | 427/90 |
| 4,321,284 | 3/1982 | Yakushiji | 427/90 |
| 4,377,438 | 3/1983 | Moriya | 156/643 |
| 4,430,152 | 2/1984 | Okano | 156/643 |

FOREIGN PATENT DOCUMENTS 2321190  3/1977  France .

OTHER PUBLICATIONS

IBM Technical Disclosure Bulletin, vol. 24, No. 12, May 1982, pp. 6421–6422, R. K. Agnihotri et al.: "Planarization of Insulators for Submicro Multi-Level Structure".

Primary Examiner—John D. Smith

[57] ABSTRACT

Process for positioning an electrical contact hole between a first and a second interconnection line of an integrated circuit. The first interconnection line is produced by depositing an insulating coating on the complete integrated circuit, depositing a first material coating on said insulating coating, etching the first material coating, defining the dimensions of the electrical contact hole by masking with resin, etching the insulating coating, eliminating the mask and the remaining first material coating.

The second interconnection line is produced by depositing a conductive coating on the complete integrated circuit, on which is deposited a second material coating, which is etched, so as to only leave material at the locations of the electrical contact hole, followed by the deposition of a resin coating, etching the area of the conductive coating where there is neither resin nor the residual second material coating and eliminating the latter and the resin coating.

5 Claims, 10 Drawing Figures

PROCESS FOR POSITIONING AN ELECTRICAL CONTACT HOLE BETWEEN TWO INTERCONNECTION LINES OF AN INTEGRATED CIRCUIT

BACKGROUND OF THE INVENTION

The present invention relates to a process for positioning an electrical contact hole between two interconnection lines of an integrated circuit. This positioning process can be more particularly used in methods for the manufacture of MOS integrated circuits (metal - oxide - semiconductor).

The invention more particularly relates to a process making it possible to produce an electrical contact between two interconnection lines of an integrated circuit, formed on two different levels.

The hitherto known positioning processes suffer from a certain number of disadvantages. Due to the alignment imprecisions between the two consecutive masking levels used for obtaining the electrical contact, it is necessary to widen the two interconnection lines at the location of the electrical contact hole.

FIG. 1 is a plan view according to the prior art of the positioning of an electrical contact hole 2 between two interconnection lines, a first line 4 and a second line 6, the first line 4 being positioned below the second line 6. The presence of the widened portions 4a, 6a, respectively of interconnection lines 4, 6, greatly limits the integration density of the integrated circuits.

SUMMARY OF THE INVENTION

The present invention relates to a process for positioning an electrical contact hole between two interconnection lines of an integrated circuit, which makes it possible to obviate this disadvantage. It more particularly makes it possible to increase the integration density of integrated circuits by at least 20% in some cases, compared with the prior art positioning process.

The invention more specifically relates to a process for the positioning of an electrical contact hole between a first interconnection line and a second interconnection line of an integrated circuit, wherein the formation of the first interconnection line of the integrated circuit is followed by the successive stages of depositing an insulating coating on the complete integrated circuit, depositing on said insulating coating, a first coating of material used for blanking or erasing the relief of the insulating coating and having a planar surface, etching the first material coating, in order to bear the relief area of the insulating coating, located above the first interconnection line, defining the dimensions of the electrical contact hole to be formed by masking with the aid of a resin, etching the insulating coating in order to form the electrical contact hole, removing the mask and eliminating the first residual material coating, and forming the second interconnection line.

This proces makes it possible to obviate any unnecessary widening of the first interconnection line at the contact point between the interconnection lines.

According to a preferred embodiment of the process according to the invention, the formation of the second interconnection line comprises the successive stages of depositing a conductive coating in which the second interconnection line will be formed on the complete integrated circuit, depositing on said conductive coating, a second coating of material for erasing or blanking the relief of the conductive coating and having a planar surface, etching the second material coating in order to only leave material at the location of the electrical contact hole, depositing a resin coating on the integrated circuit, so as to mask the second interconnection line to be formed, etching the region of the conductive coating having neither resin, nor the residual second material coating, and eliminating the residual second material coating and the resin coating.

The formation of the second interconnection line in the manner described hereinbefore obviates any unnecessary widening of this second line outside the electrical contact hole making it possible to connect the two interconnection lines.

According to an advantageous embodiment of the process according to the invention, the first and second material layers are resin layers.

According to a preferred embodiment of the process according to the invention, following the deposition of the material layers, said layers undergo a heat treatment in order to improve the smoothness of their surface.

According to another advantageous embodiment of the process according to the invention, the material layers are etched by a dry etching process using an oxygen plasma.

BRIEF DESCRIPTION OF THE DRAWINGS

The invention is described in greater detail hereinafter relative to non-limitative embodiments and with reference to the attached drawings, wherein show.

DETAILED DESCRIPTION OF THE INVENTION

Figure 1:
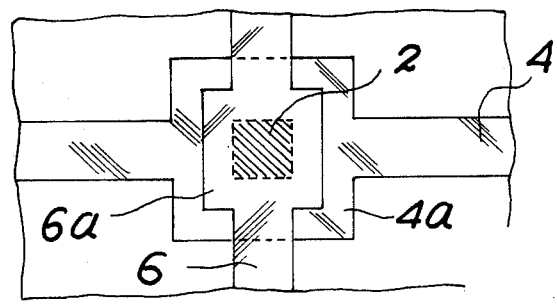
FIG. 1 already described, a plan view of the positioning of an electrical contact hole between two interconnection lines according to the prior art.
Figure 2:
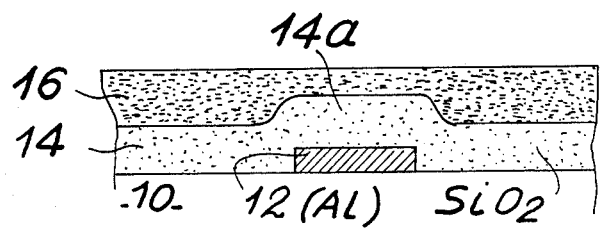
FIGS. 2 to 9 diagrammatically, the different stages of the process for positioning a contact hole according to the invention, FIGS. 2 and 4 to 9 being cross-sectional views and FIG. 3 a perspective view.

FIG. 2 shows part of an integrated circuit comprising e.g. an active area 10, corresponding to the source or the drain of a MOS transistor, which it is wished to electrically contact to another, not shown active area of the integrated circuit by means of an interconnection line 12, more particularly made from aluminium. This interconnection line 12 is produced in a conventional manner, both with regards to its deposition (magnetron sputtering) and its etching (chemical etching).

Following the formation of interconnection line 12, an insulating coating 14, preferably of silica, which may or may not contain phosphorus, is deposited on the complete integrated circuit, particularly by low pressure or non-low pressure vapour phase, chemical deposition. This insulating coating 14, e.g. having a uniform thickness of 0.8 micron, has a profile which is dependent on the underlying coatings. Above the interconnection line 12, it more particularly has a relief area 14a.

The following stage of the process consists of depositing a material coating 16 on the complete insulating coating 14, so as to erase or blank the relief, and more particularly area 14a of insulating coating 14. Material coating 16 has a planar surface and can be deposited in a conventional manner. Material coating 16 is preferably of a resin, such as the photosensitive resins conventionally used in photogravure. In this case, the material coating can be deposited by centrifuging (whirling process).

As a function of the viscosity of the resin used, a heat treatment is advantageously carried out following the deposition of the resin at a temperature making it possible to obtain a surface which is as smooth as possible, as a result of a flow of said resin coating 16. For example, the photosensitive resin can be heated to a temperature of 150° to 200° C.

It should be noted that other organic materials, such as polyimides can be used. The deposition and heat treatment of these compounds takes place in the same way as those of the photosensitive resins.

Figure 3:
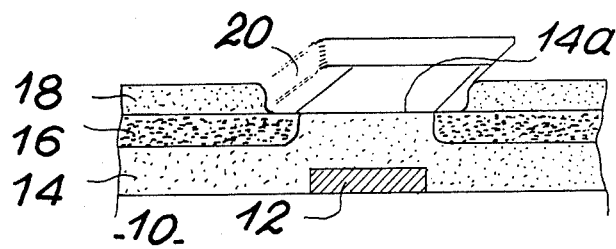

The following stage of the positioning process consists, in the manner shown in FIG. 3, of etching coating 16, which is more particularly of resin, in order to bear the relief area 14a of insulating coating 14, which is positioned above the interconnection line 12. For example, etching can be carried out a dry etching process using an oxygen plasma. It makes it possible to transversely define the electrical contact hole to be made.

Following the etching of coating 16, the integrated circuit is masked with the aid of a resin 18, so as to define the position and dimensions of the electrical contact hole which it is wished to form. Mask 18 has an opening 20, which in particular defines the longitudinal dimension of the electrical contact hole to be formed.

Figure 4:
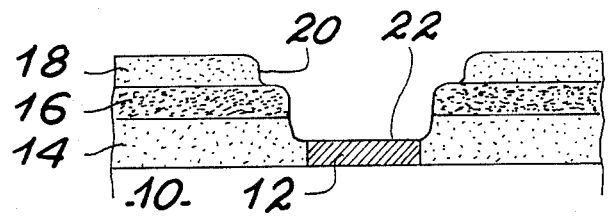

This masking is followed by an etching of the insulating coating 14, in order to form the electrical contact hole and as shown in FIG. 4. Etching of the insulating coating 14 is carried out for the regions of said coating which are not protected by mask 18, or which are not protected by the material coating 16. Etching can be carried out isotropically by dilute HF chemical etching in the case of a silica insulating coating, or anisotropic dry etching, such as reactive ionic etching, using a $CHF_3$ plasma in the case of a silica insulating coating.

Figure 5:
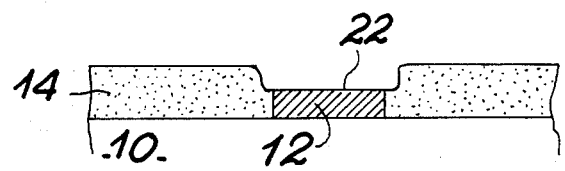
Figure 6:
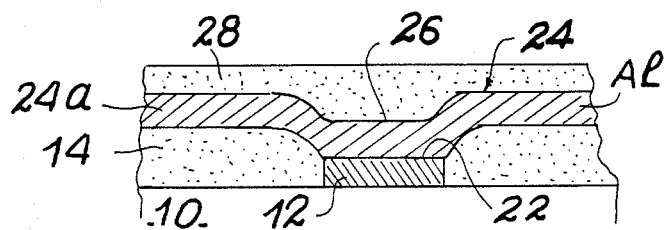

As shown in FIG. 5, the following stage of the process consists of eliminating the resin 18 used as a mask and the remaining material coating 16, e.g. of resin, using e.g. an oxygen plasma.

The following stages of the process according to the invention relate to the formation of the second interconnection line. The latter is formed firstly by depositing in per se known manner, e.g. by magneton sputtering a conductive coating 24, more particularly of aluminium, on the complete integrated circuit. This conductive coating, which has a constant thickness (approximately 1 micron) has a profile which is dependent on the underlying coatings. It more particularly has a cavity 26 in the region of the electrical contact hole 22.

The deposition of conductive coating 24 is followed by the standard deposition of a material coating 28 over the entire conductive coating. This planar material coating 28 is preferably formed from a resin, such as that normally used in photogravure. As in the case of material coating 16, resin coating 28 can be deposited by centrifuging. In the same way, as a function of the viscosity, a heat treatment is carried out following deposition, which makes it possible to make said resin coating 28 flow, in order to improve the smoothness of the surface. Heating can be carried out at 150° to 200° C. in the case of photosensitive resin.

Figure 7:
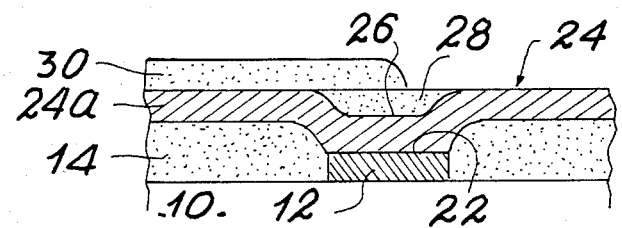

The following stage in the production of the second interconnection line consists of etching the resin material coating 28, so as to only leave material at the location of the electrical contact hole 22, i.e. in the vicinity of cavity 26 in conductive coating 24, in the manner shown in FIG. 7. Etching can be carried out e.g. with a dry etching process using an oxygen plasma.

Following the etching of resin coating 28, the second interconnection line 24a is masked by depositing a photosensitive resin coating 30 in which has been formed the image of the interconnection line, in accordance with known photogravure processes.

Figure 8:
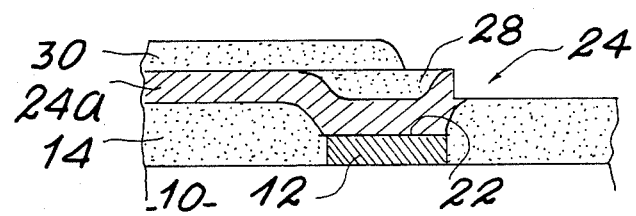

As shown in FIG. 8, the following stage of the formation of the second interconnection line 24a consists of etching the area of conductive coating 24, which neither has resin coating 30 nor residues of the resin coating 28, resin coatings 30 and 28 acting as a mask for said etching process. Etching can be carried out isotropically by chemical etching in a solution containing phosphoric acid $H_3PO_4$ in the case of an aluminium conductive coating 24. In the case of very small dimensions, preference is given to the use of an anisotropic etching process using a plasma formed e.g. from $CCl_4$.

Figure 9:
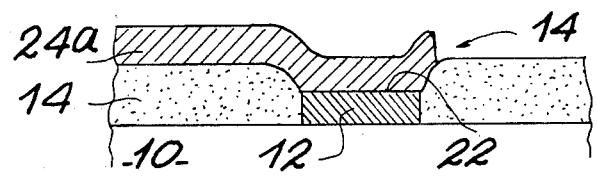

The final stage of the positioning process according to the invention consists of eliminating the residual resin coatings 30, 28, by using e.g. an oxygen plasma. The final structure is shown in FIG. 9.

Figure 10:
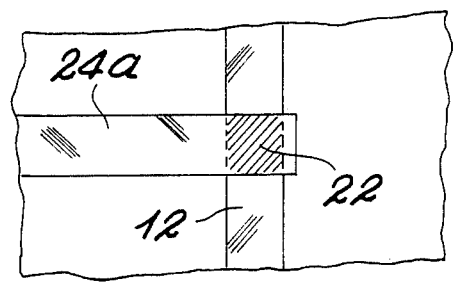
FIG. 10 a plan view of the positioning of an electrical contact hole between two interconnection lines according to the invention.

The aforementioned positioning process makes it possible to obviate any widening of the two interconnection lines 12 and 24, at the electrical contact hole 22. The process according to the invention makes it possible to obtain the ideal structure shown in FIG. 10 which, in plan view, shows the positioning of the electrical contact hole 22 between the two interconnection lines 12 and 14a. Through obviating any widening of the two interconnection lines, it permits, compared with the prior art positioning process, a significant increase in the integration density of the integrated circuit.

What is claimed is:

1. A process for positioning an electrical contact hole between a first interconnection line and a second interconnection line of an integrated circuit, comprising the steps of: forming the first interconnection line of the integrated circuit, and thereafter in successive stages:

(a) depositing an insulating coating on the integrated circuit;
   (b) depositing on said insulating coating, a first coating of a material used for blanking or erasing a relief of the insulating coating and having a planar surface;
   (c) etching the first material coating, in order to bare the relief area of the insulating coating located above the first interconnection line;
   (d) defining the dimensions of the electrical contact hole to be formed by masking with the aid of a resin;
   (e) etching the insulating coating in order to form the electrical contact hole;
   (f) removing the mask and eliminating residual portions of the first material coating;
   (g) forming the second interconnection line in successive stages:
   (h) depositing a conductive coating in which the second interconnection line will be formed on the integrated circuit;
   (i) depositing on said conductive coating, a second coating of material for erasing or blanking the relief of the conductive coating and having a planar surface;
   (j) etching the second material coating in order to only leave material at the location of the electrical contact hole;

(k) depositing a resin coating on the integrated circuit, so as to mask the second interconnection line to be formed;

(l) etching the region of the conductive coating without resin or residual portions of the second material coating; and (m) eliminating the residual second material coating and the resin coating.

2. A positioning process according to claim 1, wherein the first and second material coatings are resin coatings.

3. A positioning process according to claim 1 or 2, comprising: following deposition of the material coatings, heat treating said coatings to improve surface smoothness thereof.

4. A positioning process according to claim 1, wherein the etching of the material coatings consists of dry etching using an oxygen plasma.

5. A positioning process according to claim 1, wherein the insulating coating is a silica coating.

* * * * *